United States Patent
Vianna et al.

(10) Patent No.: US 6,894,905 B2
(45) Date of Patent: May 17, 2005

(54) COMMUNICATION DEVICE PLANE HAVING A HIGH-SPEED BUS

(75) Inventors: Rudy Vianna, Hull (CA); Simon Richardson, Kanata (CA); Christopher S. Knapton, Nepean (CA)

(73) Assignee: Nortel Networks Limited, Montreal (CA)

( * ) Notice: Subject to any disclaimer, the term of this patent is extended or adjusted under 35 U.S.C. 154(b) by 748 days.

(21) Appl. No.: 09/842,837

(22) Filed: Apr. 27, 2001

(65) Prior Publication Data

US 2002/0160743 A1 Oct. 31, 2002

(51) Int. Cl.⁷ .............................................. H01R 12/16
(52) U.S. Cl. ...................................... 361/788; 361/803
(58) Field of Search ........................ 361/788, 796–798, 361/778, 803; 7100/300–301; 439/61, 65

(56) References Cited

U.S. PATENT DOCUMENTS

| | | | | |
|---|---|---|---|---|
| 5,536,176 A | * | 7/1996 | Borchew et al. .............. | 439/61 |
| 5,703,760 A | * | 12/1997 | Zhu ............................. | 361/785 |
| 5,852,725 A | * | 12/1998 | Yen .............................. | 710/301 |
| 5,951,659 A | * | 9/1999 | McElroy et al. ............ | 710/300 |
| 6,147,863 A | * | 11/2000 | Moore et al. ................ | 361/686 |
| 6,351,719 B1 | * | 2/2002 | Harenza et al. ............. | 702/118 |

* cited by examiner

*Primary Examiner*—Kamand Cuneo
*Assistant Examiner*—Tuan Dinh
(74) *Attorney, Agent, or Firm*—G. Ronald Bell & Associates

(57) ABSTRACT

An "H layout" according to the present invention affords for a smaller, simpler, less expensive and higher performance midplane for use in a communication system for connecting various modules together. The layout is based on the concept of symmetry around a mid-section, which allows for the reuse of APM cards on the top and bottom of a midplane. All high-speed tracks on the midplane are concentrated in the center thereof. Front and back connectors on the midplane are staggered so as to permit very high module densities while maintaining manageable finger access. The present invention has the advantages of: reducing high-speed track lengths in a backplane or midplane; simplifying high speed track routing by having almost only horizontal tracks on the midplane, thus reducing crossing over; and providing a smaller midplane, thus reducing costs.

9 Claims, 7 Drawing Sheets

Top

Bottom

COMMUNICATION DEVICE PLANE HAVING A HIGH-SPEED BUS

FIELD OF INVENTION

The present invention relates to communication systems, and more particularly to the arrangement of input/output and processing cards in relation to switch cards on a plane.

BACKGROUND OF THE INVENTION

Communication systems have traditionally been built around an arrangement in which Access and Processing Modules (APMs) occupy the same physical shelf. APMs are typically input/output cards with some processing capabilities. These APMs are linked together by a high speed, common parallel bus (shared bus) on a backplane having a high number of lines.

The backplane generally accepts APMs via slot connectors in order to connect them to other parts of the system. Motherboards on modern personal computers can be considered to be a general equivalent to backplanes in communication systems. Backplanes also typically distribute power to each module connected thereto.

Backplanes are often described as being either active or passive. Active backplanes contain, in addition to the sockets or slot connectors, logical circuitry that performs computing functions. In contrast, passive backplanes contain almost no computing circuitry. In high reliability environments, passive backplanes are generally preferred to active backplanes.

Modern day high performance systems have dictated steadily increasing performance requirements. As such, backplane arrangements have evolved so as to incorporate a switching core linking the APMs. In such an arrangement, dedicated, very high-speed serial links are used between the APMs and the switching core.

The functions of the switching core linking the APMs are typically put on one or more Switch Modules (SWMs). Implementations employing SWMs have made it easier to repair faulty components and to upgrade to newer and better components. However, the number of serial connections out of each APM to each SWM in such an implementation has skyrocketed.

At the same time, to push densities further, there is a recent tendency away from the use of a single sided shelf employing a standard backplane. More and more dual sided shelves are being used which employ a midplane organization rather the single-sided backplane. Although discussions in this document will concentrate on midplanes, it is to be understood that such discussions apply equally to a single sided shelf with a conventional backplane.

With these increasing densities and the increasing number of serial connections in high performance systems, it would be ideal if one could simply increase the size of the midplane indefinitely. However, there are some constraints that prevent this indefinite increase of midplane size. Firstly, at very high speeds (2.5 Gbps and more), differential electrical serial links can only travel a limited distance before attenuation increases error rates beyond control and signal integrity is seriously impacted. As such, there is a physical limit on the length of the serial link imposed by electrical transmission characteristics.

Secondly, manufacturing economics make it very difficult to increase the size of both APMs and SWMs on one hand, and the midplane itself on the other hand. When a certain size is reached in any of these cases, manufacturing yields decrease and costs increase, making it unreasonable to pursue an increased physical size.

Additionally, the APMs and SWMs connected to a midplane have a large number of very fine pitch active devices that need soldering. The high precision soldering equipment used for active APM and SWM assembly can only accommodate boards of limited maximum board dimension when compared with the capacity of equipment used to press fit connectors onto passive backplanes. Consequently, practical board dimensions are smaller for active circuit packs than for passive backplanes. Also, SWMs typically require many more midplane connections than APMs. As such, it is somewhat difficult to accommodate both types of modules in a single midplane. Furthermore, in a recent design (year 2000), economic limits were approached on a 36" tall by 23" wide midplane, and 22" tall APM and SWM.

Therefore, there is a need to provide an arrangement that will overcome the drawbacks of the prior art and permit the connection of APMs and SWMs in such a way that the higher performance requirements of modern high-speed communication systems may be achieved.

SUMMARY OF INVENTION

It is an object of the invention to reduce high-speed track lengths in a backplane or midplane.

It is another object of the invention to simplify high speed track routing by having almost only horizontal tracks on the midplane, thus reducing crossing over.

It is a further object of the invention to provide a smaller midplane, thus reducing costs.

It is a still further object of the invention to permit the reuse of APM cards on top and bottom of a midplane (if they are designed to allow for rotation) by providing symmetry around a mid section of the midplane.

An "H layout" according to the present invention affords a smaller, simpler, less expensive and higher performance midplane. The layout is based on the concept of symmetry around a mid-section.

According to an aspect of the invention, there is provided a communication device having a high speed bus for connecting a plurality of modules, said device comprising: a first plurality of connectors for receiving a first plurality of modules, said first plurality of connectors being arranged parallel to each other and to the length of said device, and being mounted to said communication device substantially in a center portion thereof and each extending so as to substantially cover the length of said device; a second plurality of connectors for receiving a second plurality of modules, said second plurality of connectors being parallel to said first plurality of connectors and being mounted to said communication device on either side of said center portion in rows such that more than one of said second plurality of modules may be received in each of said rows.

A particular embodiment of the present invention improves on the first aspect of the invention by further comprising a third plurality of connectors for receiving a third plurality of modules, said third plurality of connectors being arranged such that they are co-linear with said first plurality of modules.

In a backplane/midplane layout according to the present invention, all high-speed tracks are advantageously concentrated in the center of the midplane. Top and bottom connectors on the midplane may be staggered so as to permit very high module densities.

The present invention also permits the achievement of very high external connection densities (such as those typical of fiber optics) while maintaining manageable finger access. This is enabled as there are 8 exit points for wiring, each one having to support a low number of APMs (top-left, top-right, bottom-left, bottom-right for both front and back of shelf). The ability to rotate the APMs also eases cabling exit to the top for top APMs, and to the bottom for bottom APMs.

BRIEF DESCRIPTION OF THE DRAWINGS

Embodiments of the present invention will be further described with reference to the accompanying drawings, in which.

DETAILED DESCRIPTION OF THE INVENTION

Figure 1:
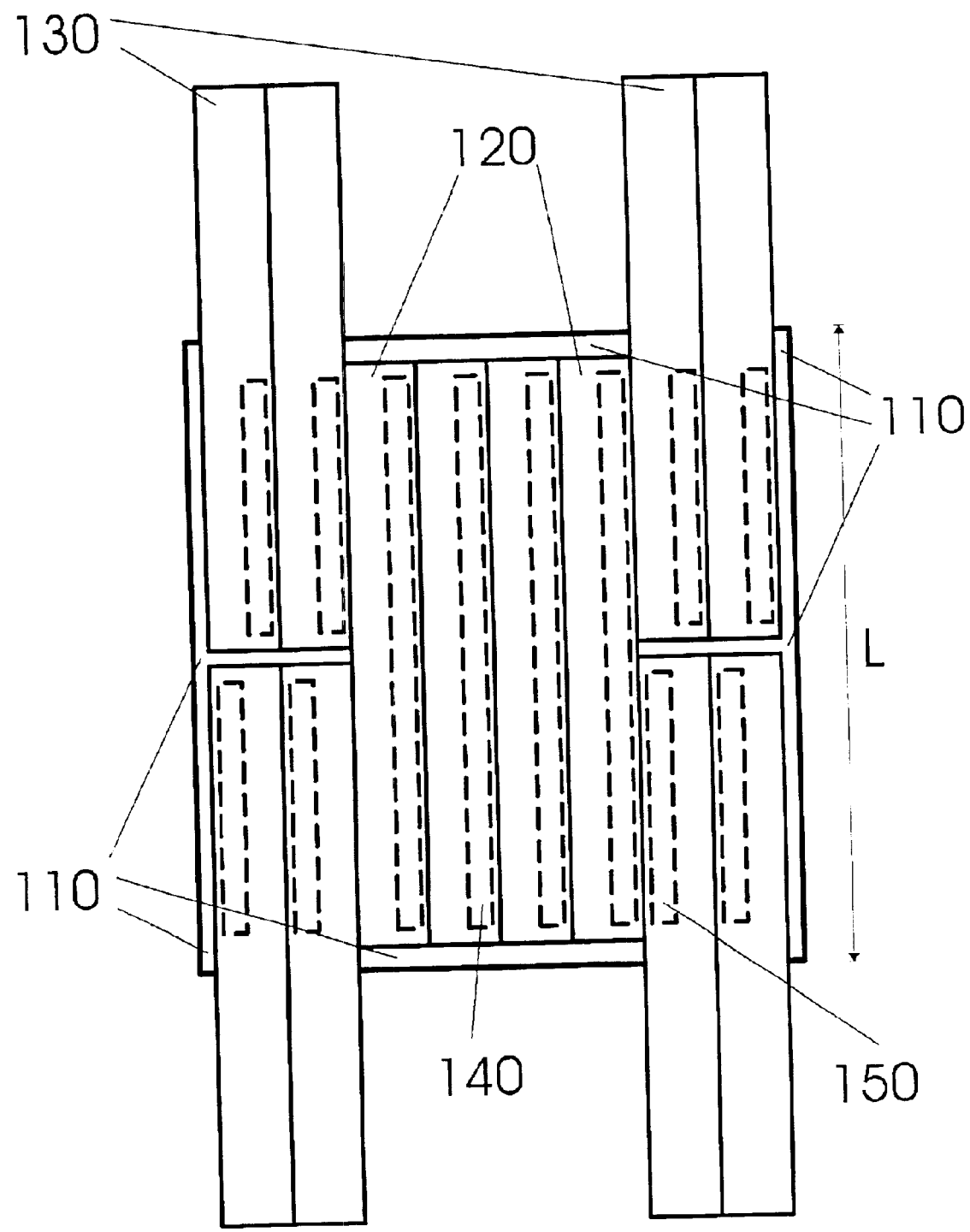
FIG. 1 illustrates diagrammatically a front view of a shelf layout according to an embodiment of the present invention.

FIG. 1 illustrates diagrammatically a front view of a shelf layout according to an embodiment of the present invention, hidden parts being shown in broken lines. It is to be noted that FIG. 1 may be regarded as either illustrating a front view of an "H" layout on a single sided backplane, or as illustrating a front view of one side of a dual sided shelf implementing the "H" layout according to the present invention.

In the "H" layout of FIG. 1, SWMs 120 are centered on midplane/backplane 110, whereas APMs 130 occupy the outside areas. Each SWM 120 is connected to the midplane 110 by means of SWM connectors 140 which are disposed along the center of the midplane. The SWM connectors 140 are preferably arranged parallel to each other and extend along substantially the entire length of the midplane 110. Each APM 130 is connected to the midplane 110 by means of APM connectors 150 that are disposed along the outside areas of the midplane in a specific layout. In a preferred embodiment, both the SWM connectors 140 and the APM connectors 150 are slot connectors.

The SWMs 120 require connection to connectors 140 along the entire length of the SWM module. The APMs 130, on the other hand, only require connection on a portion of the module, usually concentrated at one end thereof. This property makes it possible to arrange the APMs 130 in a dual row organization, i.e. two APMs may be inserted on a single row of connectors on midplane 110.

In a preferred embodiment, the midplane 110 is constructed such that its length, L, is shorter than twice the length of an APM. As such, APMs may be installed in either a top row or a bottom row of APMS. Also in a preferred embodiment, the connectors 150 may be arranged in such a way that APMs 130 may be rotated 180 degrees and moved from the top row to the bottom row. Thus, for example as in FIG. 1, the connectors 150 are staggered on the midplane in order to facilitate the rotation of the APMs 130 between the top row and the bottom row.

It can be seen from FIG. 1 that routing is short and very clean. The midplane implements mostly horizontal tracks (not shown in FIG. 1) to connect the APMs and SWMs together, while the APMs and SWMs themselves hold mostly vertical tracks. The longest midplane track length is from the outermost APM to opposite outermost SWM. This track length is typically ⅔ to ¾ of the midplane width, depending on the APM/SWM ratio of the particular card.

Figure 2:
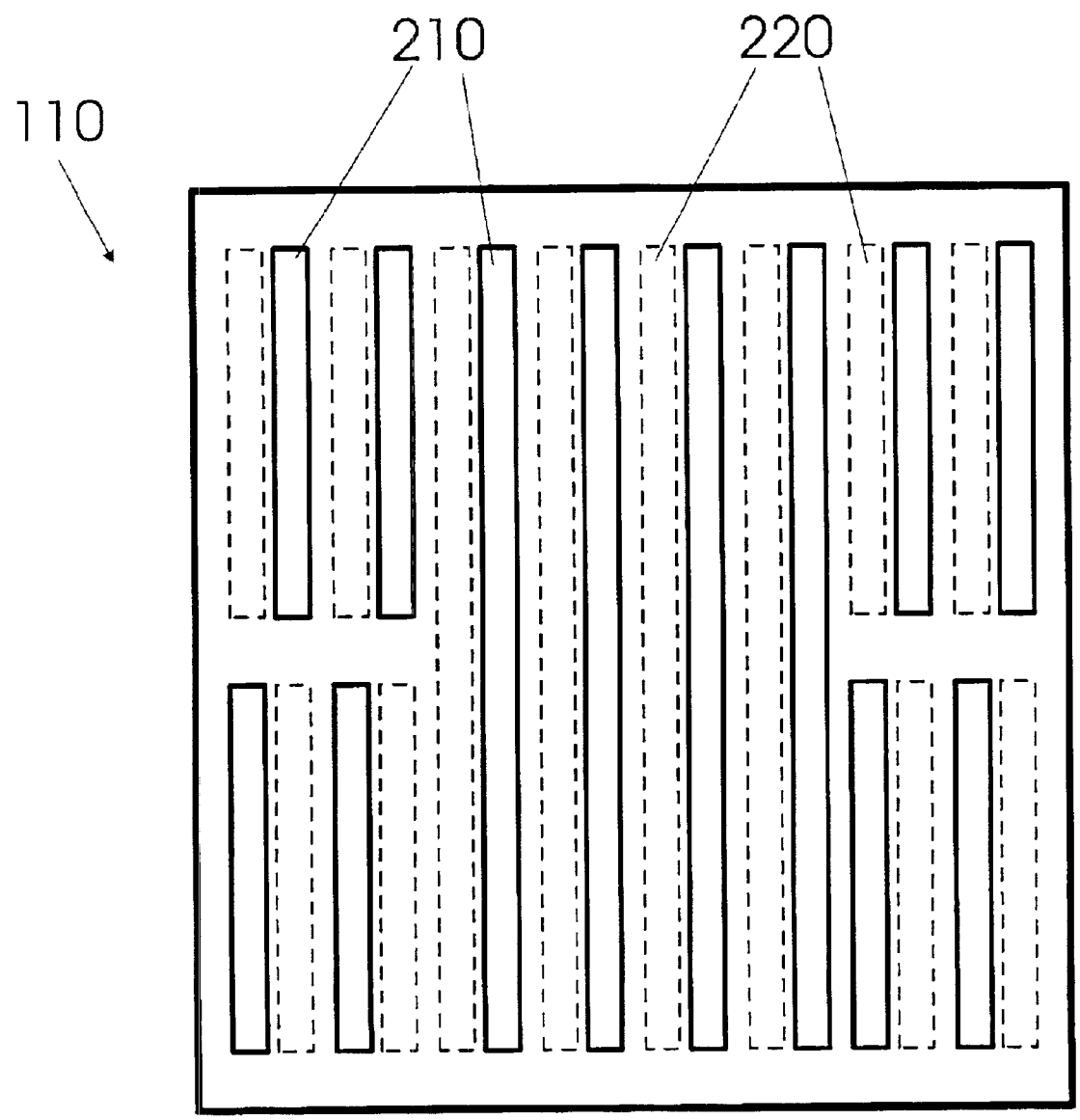
FIG. 2 illustrates a view of a dual sided shelf employing the layout of FIG. 1 showing in broken lines elements on the back that would normally be hidden.

FIG. 2 illustrates a view of a dual sided shelf midplane employing the "H" layout according to an embodiment of the present invention. In the figure, frontside module connectors 210 are shown in solid lines, while backside module connectors 220 are shown in broken lines. The frontside module connectors 210 are used to receive the APMs and SWMs connected to one side of the dual sided midplane, while the backside module connectors 220 receive the APMs and SWMs connected to the other side of the dual sided midplane. It is to be noted that the same APMs can be used either on the frontside or the backside of the midplane by rotating them. The improved "H" layout also permits these APMs to be used in either the top or bottom rows on either of the frontside or backside because the connectors are offset to one side of the pack, allowing for back-to-back mounting. It is evident from FIG. 2 that the "H" layout of the present invention not only advantageously provides short track lengths, but it also provides an optimal use of the physical space available for connecting modules to a midplane/backplane.

Figure 3:
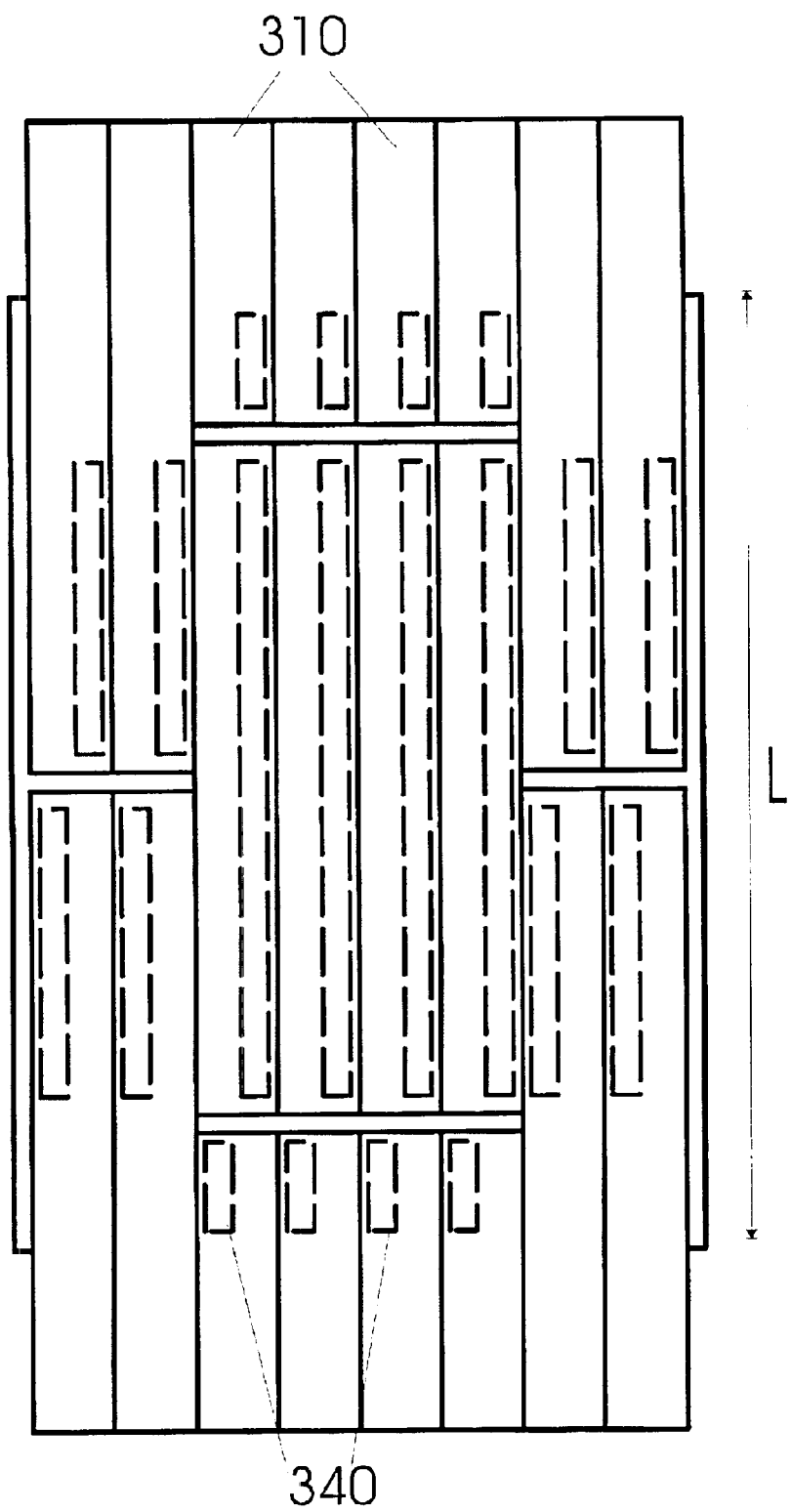
FIG. 3 illustrates another embodiment of the present invention that permits the connection of additional modules in a modified "H" layout.

FIG. 3 illustrates another embodiment of the present invention that permits the connection of additional function modules or cards in a modified "H" layout, hidden parts being shown in broken lines. This modified "H" layout has all of the advantages that permit the connection of SWMs and APMs according to the embodiment shown in FIG. 1. However, the modified layout of FIG. 4 further permits the connection of additional function modules (AFMs).

In this embodiment, the midplane/backplane 110 is constructed such that its length, L, is slightly longer than the length of an SWM. Additional module connectors 340 are disposed on the midplane 110 in the same row as the module connectors for receiving the SWMs. As such, it is possible to connect the AFMs 310 to the midplane 110 in line with the SWMs.

This arrangement permits the efficient use of "gaps" that existed in the "H" layout of FIG. 1. These gaps had resulted from the fact that the APMs extended beyond the midplane length while the SWMs did not. The AFMs 310 thus fill the gaps with a very modest increase in midplane size over the "H" layout in FIG. 1. The AFMs 310 may be used, for example, in providing shelf processors, telemetry and other functions. This modified "H" layout also provides short tracking distances from AFMs 310 to the SWMs.

FIGS. 4–9 illustrate three exemplary embodiments of the present invention.

Figure 4:
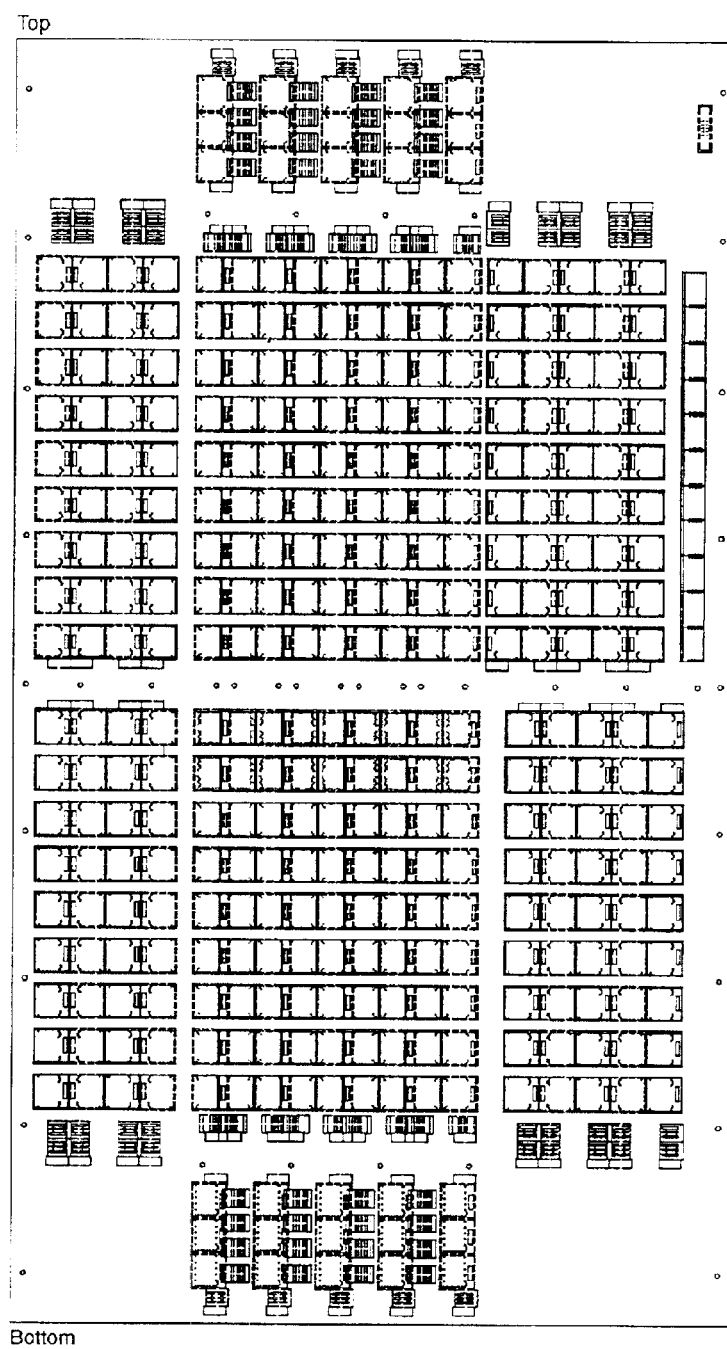
FIG. 4 illustrates a front view of a backplane/midplane according to a first exemplary embodiment of the present invention.

FIG. 4 illustrates a front view of a backplane/midplane according to a first exemplary embodiment of the present invention. This first exemplary embodiment shows a configuration that includes connectors for receiving four SWMs, eight APMs (four on each side of the SWMs) and eight AFMs.

Figure 5:
FIG. 5 illustrates an end view of a midplane according to FIG. 4.

FIG. 5 illustrates an end view of a midplane according to FIG. 4. This view shows an example of the staggered configuration that may be used in accordance with the present invention. In this end view, the AFM connectors block the view of any SWM connectors that may be provided in the configuration. Thus, in this second exemplary embodiment, the top of the midplane shows a configuration that includes connectors for receiving five AFMs and four APMs (two on each side of the AFMs). The bottom of the midplane shows a configuration that includes connectors for receiving four AFMs and five APMs (two on one side of the AFMs, and three on the other side). As such, it is demonstrated that there is no requirement for similarity of configurations on either side of a midplane according to the present invention.

Figure 6:
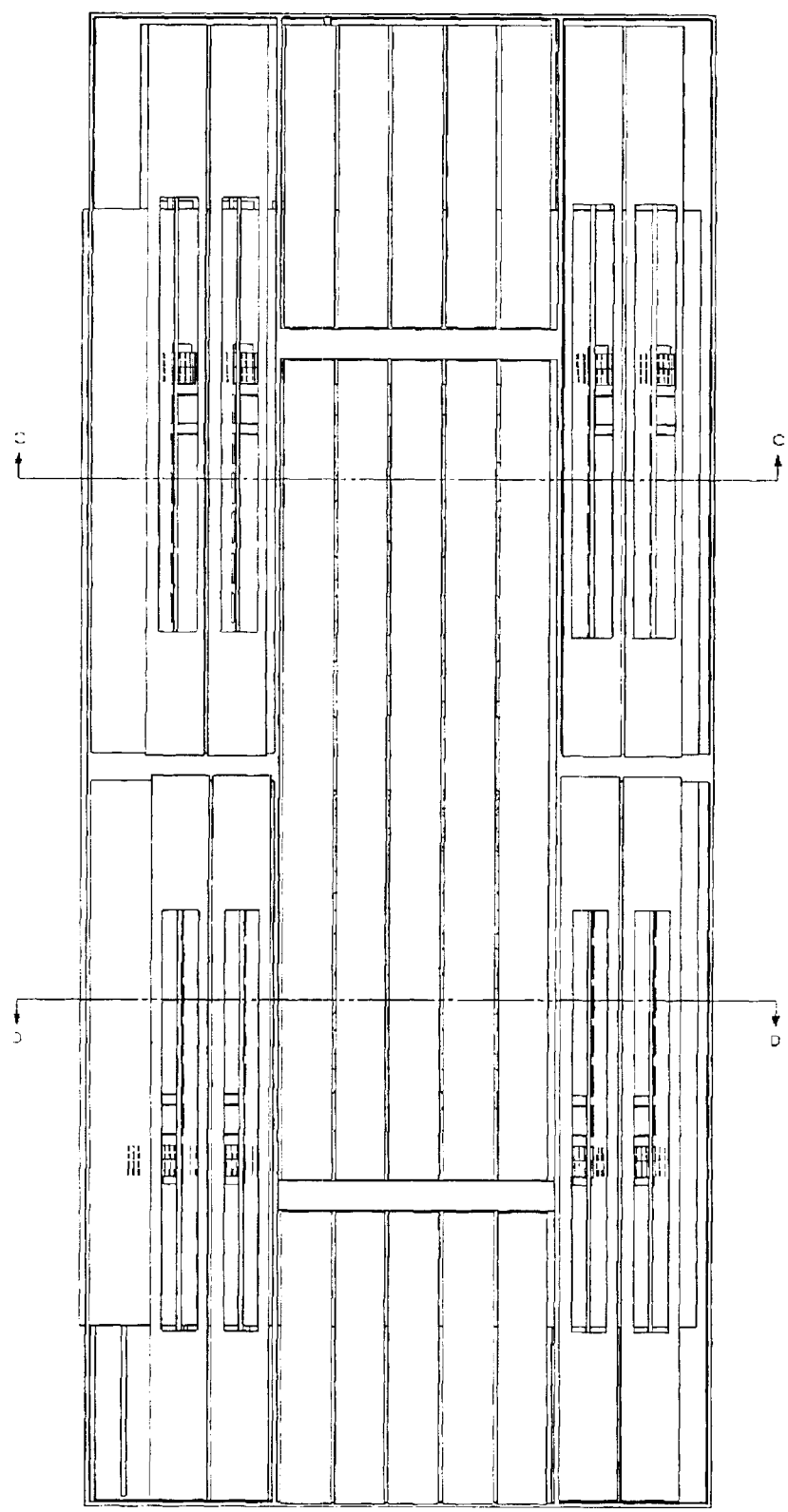
FIG. 6 illustrates an elevation view of one side ("front") of a midplane according to a second exemplary embodiment of the present invention.

FIG. 6 illustrates an elevation view of one side ("front") of a midplane according to a second exemplary embodiment of the present invention. This second exemplary embodiment shows the SWMs, APMs and AFMs connected to the midplane. The side shown in FIG. 6 illustrates a configuration that includes five SWMs, eight APMs (four on each side of the SWMs), and ten AFMs (five at either end of the SWMs).

Figure 7:
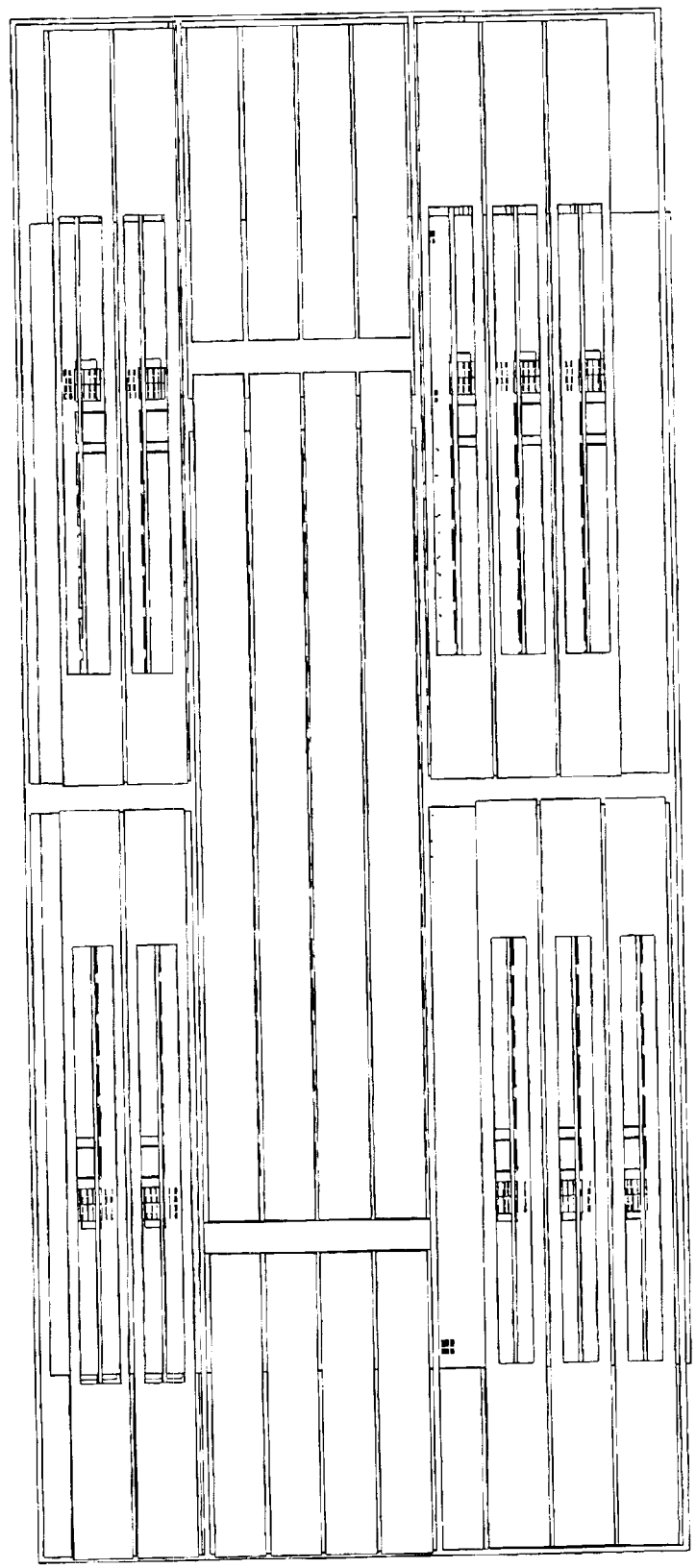
FIG. 7 illustrates an elevation view of the other side ("back") of the midplane of FIG. 6.

FIG. 7 illustrates an elevation view of the other side ("back") of the midplane of FIG. 6. The side shown in FIG. 7 illustrates a configuration that includes four SWMs, ten APMs (four on one side of the SWMs, and six on the other side), and eight AFMs (four at either end of the SWMs). Once again, this third exemplary embodiment illustrates that the configurations of the different types of modules may be different configurations on either side of a midplane according to the present invention.

Figure 8:
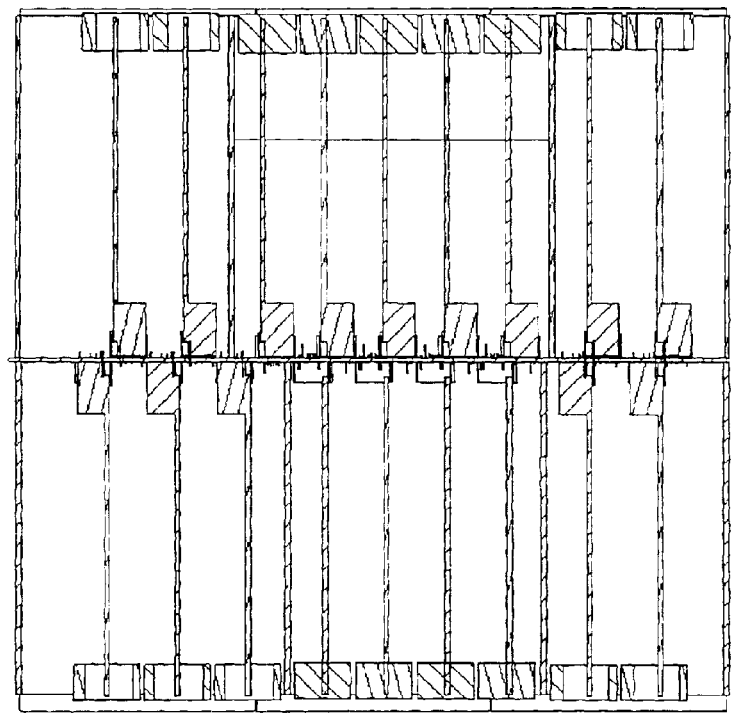
FIG. 8 illustrates a cross-sectional view along the line C—C of FIG. 6.
Figure 9:
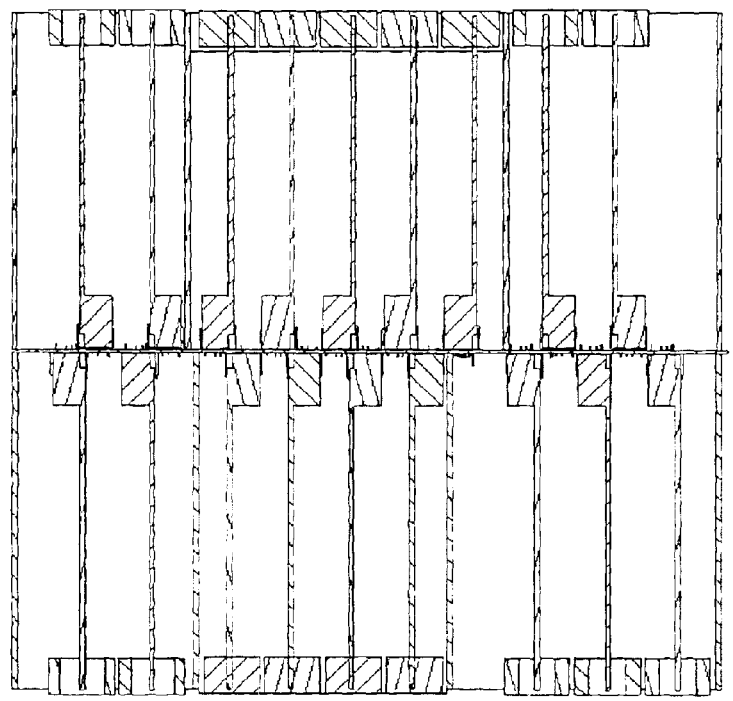
FIG. 9 illustrates a cross-sectional view along the line D—D of FIG. 6.

FIGS. 8 and 9 illustrate cross-sectional views along the lines C—C and D—D, respectively, of FIG. 6. These cross-sectional views provide an illustration of a practical implementation of the third exemplary embodiment. These views show the advantageous provision of faceplates and structural cross-members in order to provide structural integrity once the modules are connected to the midplane in their respective locations.

What is claimed is:

1. A communication device plane having a high speed bus for interconnecting a plurality of modules, said device plane comprising:

a plurality of first connectors for receiving a plurality of first modules, said plurality of first connectors being arranged in parallel with each other and longitudinally with respect to the length of said device plane, and being mounted to said communication device plane substantially centrally thereon, each of said first connectors extending so as to substantially cover the length of said device plane;

a plurality of second connectors for receiving a plurality of second modules, said second connectors being substantially parallel to said first connectors and being mounted to said communication device plane in groups on both sides of said plurality of first connectors such that two of said groups on each side may be disposed longitudinally with respect to each other, wherein said plurality of second connectors is disposed in a staggered arrangement on the communication device plane, allowing for maximum densities of alternating module: in a front row and a back row.

2. The plane according to claim 1, wherein, when said first and second modules are connected thereto, the layout of the modules on said device plane is substantially H-shaped.

3. The plane according to claim 1, wherein said plurality of second connectors is arranged in such a manner as to allow for maximum module densities.

4. The according to claim 1 further comprising: a plurality of third connectors for receiving a plurality of third modules, said plurality of third connectors being arranged such that they are co-linear with said first modules.

5. The plane according to claim 4 wherein said third connectors are disposed on either side of said first modules.

6. The plane according to claim 4 wherein the length of the device plane is slightly longer than the length of one of said first modules, which are disposed along the length of the device.

7. The plane according to claim 4 wherein said plane is a double sided midplane.

8. A communication device plane having a high speed bus for interconnecting a plurality of modules, said device plane comprising:

a plurality of first connectors for receiving a plurality of first modules, said plurality of first connectors being arranged in parallel with each other and longitudinally with respect to the length of said device plane, and being mounted to said communication device plane substantially centrally thereon, each of said first connectors extending so as to substantially cover the length of said device plane;

a plurality of second connectors for receiving a plurality of second modules, said second connectors being substantially parallel to said first connectors and being mounted to said communication device plane in groups on both sides of said plurality of first connectors such that two of said groups on each side may be disposed longitudinally with respect to each other, wherein the length of the device plane is less than twice the length of one of said second modules.

9. A communication device plane having a high speed bus for interconnecting a plurality of modules, said device plane comprising:

a plurality of first connectors for receiving a plurality of first modules, said plurality of first connectors being arranged in parallel with each other and longitudinally with respect to the length of said device plane, and being mounted to said communication device plane substantially centrally thereon, each of said first connectors extending so as to substantially cover the length of said device plane;

a plurality of second connectors for receiving a plurality of second modules, said second connectors being substantially parallel to said first connectors and being mounted to said communication device plane in groups on both sides of said plurality of first connectors such that two of said groups on each side may be disposed longitudinally with respect to each other, wherein said plane is a double sided midplane.

* * * * *